(12) United States Patent
Ma et al.

(10) Patent No.: US 10,217,897 B1
(45) Date of Patent: Feb. 26, 2019

(54) ALUMINUM NITRIDE-ALUMINUM OXIDE LAYERS FOR ENHANCING THE EFFICIENCY OF GROUP III-NITRIDE LIGHT-EMITTING DEVICES

(71) Applicant: Wisconsin Alumni Research Foundation, Madison, WI (US)

(72) Inventors: Zhenqiang Ma, Middleton, WI (US); Kwangeun Kim, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 30 days.

(21) Appl. No.: 15/726,941

(22) Filed: Oct. 6, 2017

(51) Int. Cl.
*H01L 33/06* (2010.01)
*H01L 33/32* (2010.01)
*H01L 33/44* (2010.01)
*H01L 33/00* (2010.01)
*H01L 33/14* (2010.01)

(52) U.S. Cl.
CPC ........... *H01L 33/06* (2013.01); *H01L 33/007* (2013.01); *H01L 33/0025* (2013.01); *H01L 33/14* (2013.01); *H01L 33/325* (2013.01); *H01L 33/44* (2013.01); *H01L 2933/0025* (2013.01)

(58) Field of Classification Search
USPC .......................................................... 257/13
See application file for complete search history.

(56) References Cited

U.S. PATENT DOCUMENTS

| | | | |
|---|---|---|---|
| 4,590,501 A | 5/1986 | Scholl | |
| 6,881,988 B2 | 4/2005 | Niwa et al. | |
| 7,030,428 B2 | 4/2006 | Saxler | |
| 7,354,809 B2 | 4/2008 | Yuan et al. | |
| 7,750,363 B2 | 7/2010 | Kamikawa et al. | |
| 7,777,290 B2 | 8/2010 | Lagally et al. | |
| 8,217,410 B2 | 7/2012 | Ma et al. | |
| 8,227,789 B2 | 7/2012 | Hirayama et al. | |
| 8,232,617 B2 | 7/2012 | Ma et al. | |
| 8,383,471 B1 | 2/2013 | Shinihara et al. | |
| 8,865,489 B2 | 10/2014 | Rogers et al. | |
| 9,425,351 B2 | 8/2016 | Ma et al. | |
| 2003/0032253 A1 | 2/2003 | Nguyen et al. | |
| 2004/0164319 A1 | 8/2004 | Zampardi et al. | |

(Continued)

FOREIGN PATENT DOCUMENTS

| | | |
|---|---|---|
| GB | 2453464 | 4/2009 |
| JP | 2005512327 | 4/2005 |

(Continued)

OTHER PUBLICATIONS

Gui et al., The effect of surface roughness on direct wafer bonding, Journal of Applied Physics, vol. 85, No. 10, May 15, 1999, pp. 7448-7454.

(Continued)

*Primary Examiner* — Timor Karimy
(74) *Attorney, Agent, or Firm* — Bell & Manning, LLC

(57) ABSTRACT

Light-emitting devices having a multiple quantum well (MQW) diode structure and methods of making and using the devices are provided. The devices include aluminum nitride/aluminum oxide bilayers on their hole injection layers. The bilayers improve the energy efficiency of the devices, with respect to devices that lack the bilayers or that include only a layer of aluminum oxide on their hole injection layers.

12 Claims, 17 Drawing Sheets

(56) References Cited

U.S. PATENT DOCUMENTS

| | | |
|---|---|---|
| 2005/0218428 A1 | 10/2005 | Bahl et al. |
| 2006/0086932 A1 | 4/2006 | Kim et al. |
| 2006/0121682 A1 | 6/2006 | Saxler |
| 2006/0175681 A1 | 8/2006 | Li |
| 2006/0180830 A1 | 8/2006 | Alavi et al. |
| 2008/0006845 A1 | 1/2008 | Derluyn et al. |
| 2011/0027921 A1 | 2/2011 | Hamasaki et al. |
| 2013/0214303 A1 | 8/2013 | Kinoshita et al. |
| 2013/0234168 A1 | 9/2013 | Kinoshita et al. |
| 2013/0277642 A1 | 10/2013 | Kneissl et al. |
| 2014/0264375 A1 | 9/2014 | Ma et al. |
| 2015/0124847 A1* | 5/2015 | Yoshida ............... H01S 5/0282 372/49.01 |
| 2015/0255670 A1 | 9/2015 | Furuyama et al. |
| 2016/0204306 A1* | 7/2016 | Ma ...................... H01L 33/06 257/13 |

FOREIGN PATENT DOCUMENTS

| | | |
|---|---|---|
| JP | 2007-103689 | 4/2007 |
| JP | 4959693 | 6/2012 |
| KR | 1020030063075 | 7/2003 |
| KR | 10-2005-0081207 | 8/2005 |
| KR | 1020060036713 | 5/2006 |
| KR | 10-2007-0063912 | 6/2007 |

OTHER PUBLICATIONS

Chen et al., Epitaxially oriented growth of diamond on silicon by hot filament chemical vapor deposition, Appl. Phys. Lett., vol. 68, No. 2, Jan. 8, 1996, pp. 176-178.

Barnett et al., 50% Efficient Solar Cell Architectures and Designs, Conference Record of the 2006 IEEE 4th World Conference on Photovoltaic Energy Conversion, Waikoloa, HI, May 7-12, 2006, pp. 2560-2564.

International Search Report and Written Opinion issued in PCT/US2014/011569, May 20, 2014.

International Search Report and Written Opinion issued in PCT/US2015/054018, dated Feb. 11, 2016, 11 pages.

Park et al., Review—Group III-Nitride-Based Ultraviolet Light-Emitting Diodes:Ways of Increasing External Quantum Efficiency, ECS Journal of Solid State Science and Technology, 6 (4) Q42-Q52, Feb. 8, 2017.

Liu et al., Al2O3/AlN/GaN MOS-Channel-HEMTs With an AlN Interfacial Layer, IEEE Electron Device Letters, vol. 35, No. 7, May 29, 2014, pp. 723-725.

Liu et al., Interface/border trap characterization of Al2O3/AlN/GaN metal-oxide-semiconductor structures with an AlN interfacial layer, Applied Physics Letters 106, Feb. 5, 2015, pp. 051605-1-051605-4.

Zhang et al., Nitridation of GaN Surface for Power Device Application: A First-Principles Study, 2016 IEEE International Electron Devices Meeting, Dec. 2016.

* cited by examiner

ALUMINUM NITRIDE-ALUMINUM OXIDE LAYERS FOR ENHANCING THE EFFICIENCY OF GROUP III-NITRIDE LIGHT-EMITTING DEVICES

REFERENCE TO GOVERNMENT RIGHTS

This invention was made with government support under HR0011-15-2-0002 awarded by the DOD/DARPA. The government has certain rights in the invention.

BACKGROUND

Over the past decades, improving energy conversion efficiency of InGaN/GaN blue light-emitting diodes (LEDs) has been persistently pursued. The continuous improvement of the energy efficiency of the InGaN/GaN LEDs mainly originated from developments in wafer growth techniques, packaging technologies, and nanophotonics. The major bottleneck toward achieving high efficiency LEDs is the low hole injection rate from the p-type hole transport layer (p-GaN:Mg) due to insufficient activation of the p-type dopant. The poor hole injection leads to a significant imbalance between the number of electrons and holes, leading to poor electron-hole recombination rates and, thus, low efficiency at high current densities. A number of research efforts have been geared toward making a breakthrough in this issue, including formation of a surface polarization layer, electron blocking layer, tunnelling layer, graded barrier structure, and nanopatterning. While these approaches helped improve energy conversion efficiency, there still exist issues such as the high cost for wafer regrowth and non-uniform surface patterning over a full-wafer area, in addition to strains induced by different thermal expansion coefficients and by different lattice constants between substrates and epitaxial layers.

The InGaN/GaN LEDs grown on a c-plane sapphire substrate possess a piezoelectric polarization field induced by the lattice mismatch between the InGaN and GaN layers. Additionally, the Wurtzite crystal structure of GaN generates a spontaneous polarization field in the LEDs, which consequently forms tiled energy bands within the InGaN/GaN multi-quantum wells (MQWs), leading to a reduced spatial distribution of electron and hole wave functions and, thus, reduced radiative recombination rates (i.e., quantum-confined Stark effect (QCSE)). Several methods were attempted to suppress the QCSE in LEDs, such as adaptation of nonpolar or semipolar substrates, polar MQWs with large wave function overlap design, substrate variation, polarization-matched epi-layer, top surface modification, and 1-dimensional vertical structure array. These methods require complicated device design, special/expensive substrates, and skillful epitaxy techniques. Various processes for LED top surface modification were also attempted including surface texturing, less-strained layer growth, and thin layer deposition. Although these surface modification approaches are simpler than other epitaxial methods, the cost associated with these approaches may still be high.

SUMMARY

Light-emitting devices and methods of making and using the devices are provided.

One embodiment of a light-emitting device includes: a hole injection layer comprising a single-crystalline p-type doped Group III-nitride semiconductor; an electron injection layer comprising a single-crystalline n-type doped Group III-nitride semiconductor; a light-emitting active region comprising intrinsic or n-type doped Group III-nitride semiconductor layers disposed between the hole injection layer and the electron injection layer, the light-emitting active region comprising a multiple quantum well structure comprising alternating barrier layers and quantum well layers; a layer of aluminum nitride on the hole injection layer; and a layer of aluminum oxide on the layer of aluminum nitride. The light-emitting devices include blue light emitting diodes and ultraviolet light emitting diodes.

The incorporation of the aluminum nitride and aluminum oxide layers into a device can increase at least one of the device's wall-plug efficiency, external-quantum efficiency, and luminous efficiency, relative to a light-emitting device that lacks both the layer of aluminum nitride and the layer of aluminum oxide, but otherwise has the same device structure.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2A shows the XPS Ga 3d core levels of the three samples (before LED fabrication). Ga—N and Ga—O denote Ga bonded to N and Ga bonded to O, respectively. FIG. 2B shows the Ga 3d binding energy and Ga—O/Ga—N intensity ratio of samples A, B, and C. FIG. 2C shows the XPS Al 2p core level binding energies of samples B and C.

FIG. 3A depicts the surface potential and band bending for the sample A LED. FIG. 3B shows the surface potential and band bending for the sample B LED. FIG. 3C exhibits the surface potential and band bending for the sample C LED. $Q_{SP}^{GaN}$ and $Q_{SP}^{AlN/Al_2O_3}$ indicate the polarization charges in the top p-GaN and AlN/Al$_2$O$_3$ layers, respectively. + and − symbols denote the positive and negative polarization charges.

FIG. 4A shows the PL spectra of the sample A, B, and C GaN LEDs. FIG. 4B shows a plot of the PL peak intensity and wavelength properties of the sample A, B, and C LEDs.

FIG. 6A shows the EL spectra of the sample A GaN LED. FIG. 6B shows the EL spectra of the sample B GaN LED. FIG. 6C shows the EL spectra of the sample C GaN LED as the driving current density increases from 0.1 to 40 A/cm$^2$. The two dashed lines indicate the peak wavelength at 0.1 and 40 A/cm$^2$, respectively. Insets in FIGS. 6A-6C show the CIE1931 chromaticity diagram including the chromaticity coordinates of EL spectra of the sample A, B, and C LEDs, respectively. FIG. 6D shows the EL intensity of the sample A, B, and C GaN LEDs as the driving current density increases from 0.1 to 40 A/cm$^2$. FIG. 6E shows the EL peak wavelength blue-shift of the sample A ($\Delta\lambda_A$), B ($\Delta\lambda_B$), and C ($\Delta\lambda_C$) GaN LEDs as the driving current density increases from 0.1 to 40 A/cm$^2$.

FIG. 7A shows radiant flux as a function of current density. FIG. 7B shows luminous flux as a function of current density. FIG. 7C shows the number of emitted photons and injected electrons of the sample A, B, and C LEDs as a function of current density.

FIG. 8A shows the energy band diagrams of the sample A and C LEDs. hv$_A$ and hv$_C$ indicate the photon energies of the sample A and C LEDs. FIG. 8B shows a band diagram of a single quantum well (QW) near the GaN:Mg of the sample A LED with a quantum-confined Stark effect (QCSE). FIG. 8C shows a band diagram of a single QW near the GaN:Mg of the sample C LED with a band filling effect and screening of internal polarization field (i.e., suppressed QCSE) by the increased hole injection into the QW. $\Psi_e$ and $\Psi_h$ denote the electron and hole wave function profiles in the QW, and $P_{sp}$ indicates the internal spontaneous polarization in the Wurtzite GaN LED (0001).

FIG. 9A shows wall-plug efficiency (WPE). FIG. 9B shows the efficiency droop rate of the LEDs as a function of current density for WPE. FIG. 9C shows external quantum efficiency (EQE). FIG. 9D shows the efficiency droop rate of the LEDs as a function of current density for EQE. FIG. 9E shows Efficacy. FIG. 9F shows the efficiency droop rate of the LEDs as a function of current density for Efficacy.

DETAILED DESCRIPTION

Light-emitting devices having a multiple quantum well (MQW) diode structure and methods of making and using the devices are provided. The devices include aluminum nitride/aluminum oxide bilayers on their hole injection layers. The bilayers improve the energy efficiency of the devices, with respect to devices that lack the bilayers or that include only a layer of aluminum oxide on their hole injection layers.

One embodiment of a light-emitting device is a light-emitting diode (LED) having a diode structure that includes a hole injection layer comprising a single-crystalline p-type doped Group III-nitride semiconductor; an electron injection layer comprising a single-crystalline n-type doped Group III-nitride semiconductor; an intrinsic or n-type doped light-emitting active region disposed between the hole injection layer and the electron injection layer; a layer of aluminum nitride on the hole injection layer; and a layer of aluminum oxide on the layer of aluminum nitride.

The active region includes a MQW structure comprising alternating barrier and quantum well layers, which are made of different Group III-V semiconductor materials. In the MQW structures, charge carriers are confined via quantum confinement in thin layers of semiconductor "well" material, which are sandwiched between layers of semiconductor "barrier" material. The active region may further comprise a lower spacer layer and/or an upper spacer layer between which the MQW structure is disposed. The spacer layers are used to increase the thickness of the active region. If the spacer layers form part of an intrinsic active region, they are comprised of undoped single-crystalline semiconductor materials.

Other components that may be part of the light-emitting devices are those commonly incorporated into such devices, including a substrate, buffer layers, grading layers, cladding layers, reflectors, electrically conductive contact layers, electrodes and interconnects. For example, the devices may further comprise electrodes in electrical communication with the p-type and n-type doped semiconductor materials and a voltage source configured to apply a voltage across the active region.

Figure 5A:
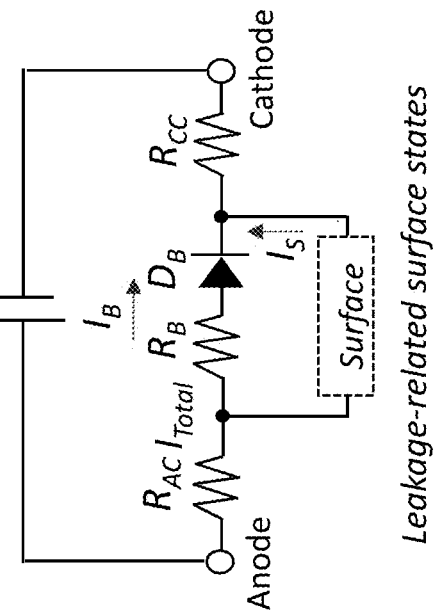
FIG. 5A is a schematic diagram of one embodiment of the sample C LED.

A schematic diagram of one embodiment of an LED is provided in FIG. 5A. The LED includes a substrate 102 and an electron injection layer 104 comprising an n-type doped Group III-nitride semiconductor. If substrate 102 is a growth substrate upon which the electron injection layer 104 cannot be epitaxially grown (e.g., because the materials do not have a sufficiently close lattice match), the heterostructure can further include a buffer layer between substrate 102 and electron injection layer 104 to facilitate the epitaxial growth of the electron injection layer. Active region 106 comprising a MQW structure is disposed on electron injection layer 104 and a p-type doped layer of Group III-nitride semiconductor provides the hole injection layer 108. A layer of AlN 110 is disposed on hole injection layer 108 and a layer of Al$_2$O$_3$ 112 is disposed on AlN layer 110. An anode 114 and a cathode 116 are placed in electrical communication with hole injection layer 108 and electron injection layer 104, respectively.

The aluminum nitride layer and the aluminum oxide layer can be very thin. By way of illustration, in some embodiments, both the aluminum nitride layer and the aluminum oxide layer have a thickness of 5 nm or lower. This includes embodiments in which the aluminum nitride layer and the aluminum oxide layer have thicknesses of 3 nm or lower, or of 2 nm or lower. For example the thicknesses of these layers can be in the range from about 1 nm to 5 nm. However, thicknesses outside of these ranges can be used. The thicknesses of the layers of single-crystalline Group III-V semiconductors that make up the other parts of the devices will depend on the intended light-emitting device application. However, by way of illustration, in some embodiments of the devices, some or all of the layers of single-crystalline semiconductor material have thicknesses of no greater than about 1000 nm. If the semiconductor materials of the charge injection layers absorb radiation within the emission wavelength range of the active region, it is advantageous to use a very thin layer of the materials. For example, the p-type and/or n-type doped semiconductor layers may be thinned to a thickness of 10 nm or less, including thicknesses of 5 nm or less.

The Group III-V semiconductors used to form the various layers of the light-emitting devices can be represented by the formula $Al_xIn_yGa_{(1-x-y)}N$, where the values of x and y can range independently from 0 to 1. Examples of group III-nitride semiconductors include GaN, InGaN, InAlN, AlN and AlGaN. In particular, the hole injection layers can comprise, for example, p-type doped $In_xGa_{(1-x)}N$, where x has a value ranging from 0 to 0.30. Alternatively, the hole injection layer can comprise, for example, p-type doped $Al_xGa_{(1-x)}N$, where x has a value ranging from 0 to 0.55.

The wavelengths of the radiation emitted by the light-emitting devices will depend on the semiconductor materials used in the active region. Thus, with the proper selection of materials, the light-emitting devices can be configured to emit in the ultraviolet (UV; from ~100 to 400 nm, including 220 to 240 nm), visible (vis; from 400 to 780 nm) and/or infrared (IR; from 780 nm to 1 mm; e.g., 1.55 μm) regions of the electromagnetic spectrum. By way of illustration, a light-emitting device designed to emit blue light could employ an active region having an MQW structure comprising alternating layers of single-crystalline InGaN quantum well layers and single-crystalline GaN barrier layers. This active region can be grown epitaxially over an n-type GaN electron injection layer. A layer of p-type GaN can serve as a hole injection layer for the device.

Alternatively, a light-emitting device designed to emit light in the wavelength range from about 220 to 240 nm could employ an active region having an MQW structure comprising alternating layers of single-crystalline AlGaN quantum well layers and single-crystalline AlN barrier layers. This active region can be grown epitaxially over an n-type AlGaN electron injection layer. A layer of p-type AlGaN can serve as a hole injection layer for the device.

The aluminum nitride/aluminum oxide bilayers improve the energy efficiency of light-emitting devices that include the bilayers, relative to light-emitting devices that lack the bilayers, but otherwise have the same device structure. The improvement in the energy efficiency can be measured in terms of the peak efficiency value for a device's wall plug efficiency, external-quantum efficiency, luminous efficiency, and/or their corresponding droop rates. The wall-plug efficiency (WPE) can be calculated using the equation:

$$WPE = \frac{\Phi_e}{I \cdot V}$$

where $\Phi_e$ is the radiant flux, I is the injection current and V is the injection voltage. The external quantum efficiency (EQE) can be calculated using the equation:

$$EQE = \frac{\Phi_e/h\nu}{I/e}$$

where h is Planck's constant and ν is the photon frequency. The luminous efficacy (i.e., Efficacy) can be calculated using the equation:

$$Efficacy = \frac{\Phi_v}{I \cdot V}$$

where $\Phi_v$ is the luminous flux. Experimental methods for measuring WPE, EQE, and Efficacy are explained in the Example. By way of illustration, in various embodiments of the light-emitting devices the aluminum nitride/aluminum oxide bilayers improve the WPE, EQE, and/or Efficacy of the device by at least 10%. This includes embodiments in which the bilayers improve the WPE, EQE, and/or Efficacy of the device by at least 20%, and further includes embodiments in which the bilayers improve the WPE, EQE, and/or Efficacy of the device by at least 25%. Similarly, in various embodiments of the light-emitting devices the aluminum nitride/aluminum oxide bilayers decrease the WPE, EQE, and/or Efficacy droop rates by at least 10%, at least 5% and at least 1%, respectively.

Unless otherwise indicated, any values recited herein that vary as a function of temperature and/or pressure refer to those values at room temperature (RT, ~23° C.) and/or atmospheric pressure.

Without being bound to any particular theory of the invention, one explanation for the improvements in WPE, EQE, and Efficacy is that the stacked $AlN/Al_2O_3$ layers may serve not only to provide surface passivation, but also to increase the hole injection rate into the active region of the light-emitting devices and to suppress the QCSE in the MQW structure. As discussed in greater detail in the Example, the positive polarization charges in the monocrystal-like AlN layer can increase the hole injection rate into the active region of a light-emitting device by inducing a downward band bending and a repulsive force in the valence band of the p-type doped hole injection region of the device. The increased number of injected holes induces a band-filling effect and the screening of the internal polarization field in the MQW of the GaN LED. Then, the reduced polarization field decreases the slope of the QW, leading to an increased overlapping area and vertical distance between the electron and hole wave functions. As a result, the radiative recombination rate is increased and the energy of the emitted-photons is also increased, relative to that of photons emitted from an analogous device without the $AlN/Al_2O_3$. The overall effects of surface deposition of $AlN/Al_2O_3$ suppressed QCSE.

EXAMPLE

In this example, detailed studies on the impact of PEALD $AlN/Al_2O_3$ on the energy conversion efficiency of InGaN/GaN blue LEDs are reported.

XPS was used to characterize the surface potential changes inside the p-GaN layer of InGaN/GaN LEDs coated with the $AlN/Al_2O_3$ stacked passivation and polarization layers. Three roles played by the PEALD $AlN/Al_2O_3$ on the InGaN/GaN LEDs were discovered. 1) The surface defect states of p-GaN in relation to leakage and oxidation were reduced by the passivation function of the layers. 2) The hole injection rate into the MQW was enhanced by increasing the surface potential of p-GaN and by forming a repulsive force on the hole in the valence band of the p-GaN. The surface recombination of holes on p-GaN was also reduced by the increased surface potential. 3) The QCSE in the MQW was suppressed by the band-filling effect and by screening of the internal polarization field due to the increased hole injection. As a result of the above factors, the radiative recombination rate and light emission efficiency of the InGaN/GaN LEDs were improved, and efficiency droop rates were reduced.

Experimental Section

InGaN/GaN LED Wafer Preparation

The InGaN/GaN LED wafers were grown on a patterned sapphire substrate (PSS) along the (0001)-orientation by metal organic chemical vapor deposition (MOCVD). An undoped GaN buffer layer was grown first, followed by a 600 nm Si-doped GaN layer with a doping concentration of ~$10^{19}$ cm$^{-3}$ and a ~350 nm GaN grading layer. Next, an eight-period InGaN/GaN MQW with a targeted wavelength of ~450 nm was grown. The growth of the LED structure was finished with an Mg-doped GaN layer. After epi-growth, the LED wafers were further processed via wet chemical cleaning steps, beginning with sonication in acetone/isopropyl alcohol at room temperature (RT), followed by RCA cleaning. Three types of samples were prepared in the experiment.

PEALD Process

After a wet cleaning procedure, the LED wafer (for sample C) was loaded into the PEALD system. An in situ RPP process in sequence with $NH_3$—Ar—$N_2$ plasma was performed to remove surface native oxide on the GaN. After the RPP process, the 0.6 nm AlN monolayer using $N_2$—$H_2$ and trimethylaluminum (TMA) precursors and the 1 nm $Al_2O_3$ layer using $H_2O$ and TMA precursors were chronologically deposited by PEALD with a growth rate of 0.6 Å/cycle. The RPP and PEALD were carried out at a substrate temperature of 300° C. The detailed process is described elsewhere previously. (See, S. Huang, et al., IEEE Electron Device Lett. 33 (2012) 516-518; and S. Liu, et al., Appl. Phys. Lett. 106 (2015) 051605.) The thicknesses of the AlN/$Al_2O_3$ stacked layers were measured by an ellipsometer.

XPS Measurements

The elements' core energy level shifts in the top Mg-doped GaN layer of the sample A, B, and C GaN LEDs were measured using XPS. The valence band maximum (VBM) and core levels of Ga 3d, Al 2p, C 1s, N 1s, and O 1s were scanned to analyse the surface potential changes of the GaN under different oxide coating conditions. A monochromatic Al Kα (hv=1486.60 eV) X-ray source with a 90° take-off angle (normal to surface) was used with a filament current of 1.66 A, an emission current of 2.98 mA, and accelerating voltage of 12 kV. The scans were repeated 20 times with a survey step of 0.01 eV, spot size of 100 μm, pass energy of 50 eV, and dwell time of 50 ms. The XPS equipment was calibrated using the standard peak positions at 933.00 eV of Cu 2p3/2, 368.20 eV of Ag $3d_{5/2}$, and 84.00 eV of Au $4f_{7/2}$. The 284.80 eV of C 1s peak was referenced to offset the binding energy shift induced by the surface charge. The uncertainty of the core level centers was ±0.015 eV.

Fabrication of GaN LEDs

GaN LEDs were fabricated on the XPS-characterized samples A, B, and C, respectively. The three types of LEDs were fabricated together from the beginning to the end of the process. Ni/Au (5/300 nm) was deposited for anodes, followed by cathode mesa etching using inductively coupled plasma with $BCl_3$, $Cl_2$, and Ar gas at a flow rate of 10, 16, and 3 sccm, respectively, 100/500 W ICP/RF power, 190 V DC voltage, and 4 mT pressure. Ti/Al (5/300) was deposited for cathodes and a subsequent ohmic annealing was carried out at 500° C. for 30 s in $N_2$ ambient for both anodes and cathodes. All electrodes were formed by photolithography, e-beam evaporation and lift-off. After isolation, the active area of the GaN LEDs was defined to be 0.0025 cm$^2$. The fabricated GaN LEDs with interconnection electrodes were Al wire-bonded for the efficiency measurements using an integrating sphere. No light extraction fixtures were used for three types of fabricated LEDs.

Characterizations

I-V characteristics were measured using a Keithley 4200-SCS semiconductor characterization system. PL spectra were obtained using a Horiba Jobin Yvon Labram Aramis Raman spectrometer equipped with an He—Cd laser source. EL spectra were acquired using a Gamma Scientific GS-1290 spectroradiometer with a calibrated integration sphere. Input bias for efficiency measurements was supplied by a Keithley 2602B system source meter. Chemical bonding states were analysed by a Thermo Fisher Scientific K-Alpha+ XPS. All measurements were made at RT.

Results and Discussion

Surface Characterization

Figure 1A:
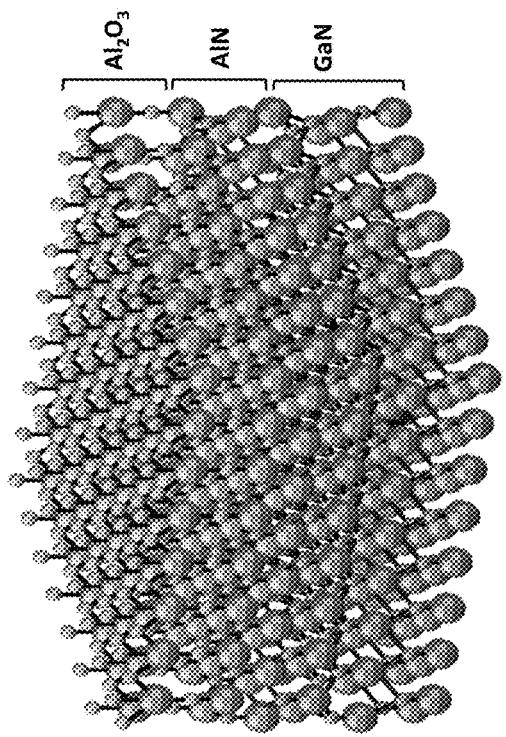
FIG. 1A illustrates the formation of surface AlN/Al$_2$O$_3$ stacked layers on a GaN:Mg layer of an InGaN/GaN-based LED via remote plasma pretreatment (RPP) and plasma-enhanced atomic-layer deposition (PEALD) processes. It begins with RPP native oxide removal (I), followed by surface nitridation (II), PEALD of a 0.6-nm-thick AlN monolayer (III), and PEALD of a 1-nm-thick Al$_2$O$_3$ layer (IV). The deposition of the AlN interface layer can be precisely controlled to be one monolayer.
Figure 1B:
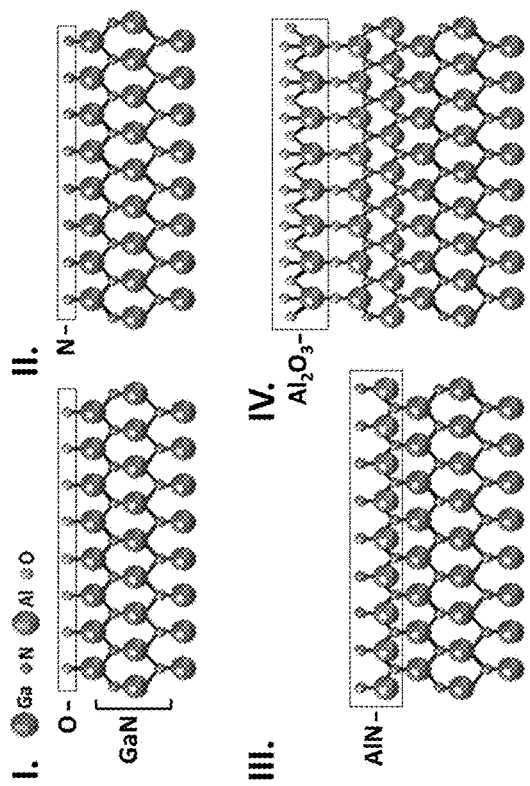
FIG. 1B shows the atomic crystal structure of the AlN/Al$_2$O$_3$-capped GaN top layers after finishing the PEALD process.

FIG. 1A illustrates the atomic structures of the top layers of sample C at different stages of the RPP and PEALD processes, which entails RPP native oxide removal (I), nitridation (II), PEALD of the 0.6 nm AlN monolayer (III), and PEALD of the 1 nm $Al_2O_3$ layer (IV). The deposition of the AlN interface layer was precisely controlled to be one monolayer. An atomic crystal structure of the top layer of Sample C after finishing the PEALD is presented in FIG. 1B.

Figure 2B:
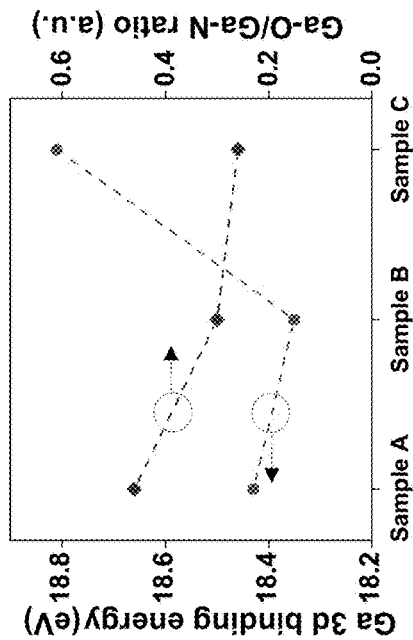
FIGS. 2A-2C depict the passivation properties of the AlN/Al$_2$O$_3$ layers for the GaN:Mg. X-ray photoelectron spectroscopy (XPS) was used for surface characterization. The reference sample A was a bare sample without an AlN or Al$_2$O$_3$ coating. Sample B was coated with 1 nm Al$_2$O$_3$ using conventional ALD. Sample C was coated with 0.6 nm/1.0 nm AlN/Al$_2$O$_3$ using PEALD.
Figure 2A:
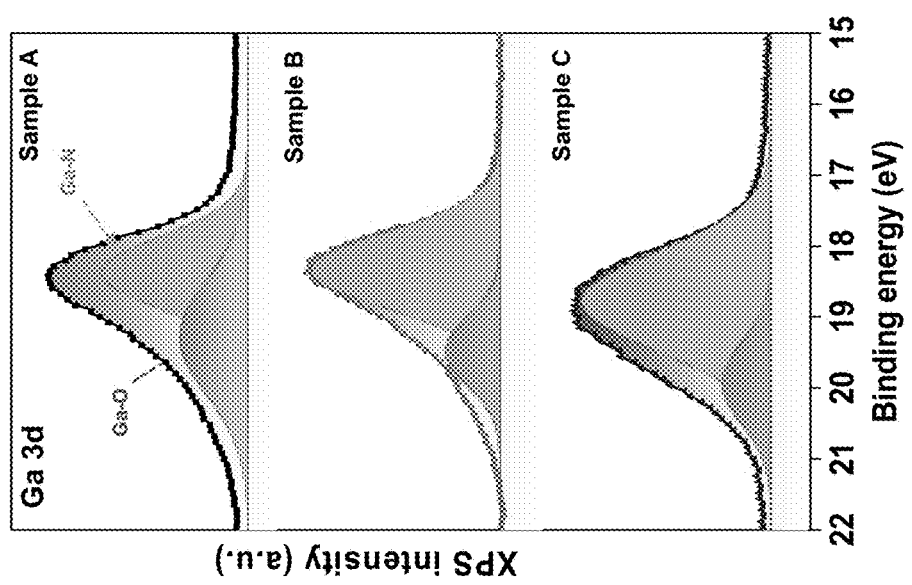
Figure 2C:
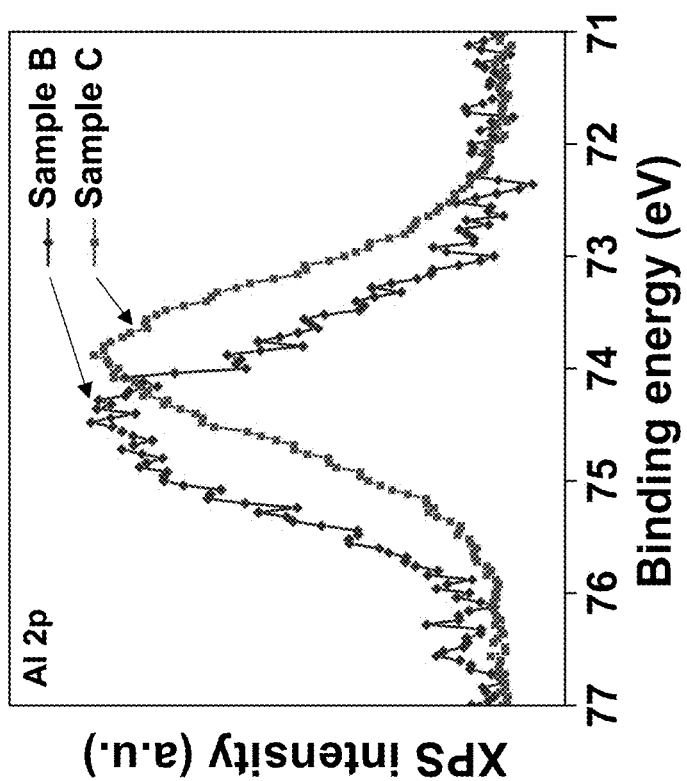

The passivation properties of the AlN/$Al_2O_3$ layers for the GaN:Mg were analysed using XPS measurements. A total thickness of 1.6 nm of AlN/$Al_2O_3$ is suitable for XPS characterization, since photoelectrons can escape from 10 nm deep from the surface. The XPS Ga 3d core levels of the three samples (before LED fabrication) were obtained and divided into two components: Ga—N and Ga—O, as shown in FIG. 2A. For samples A, B and C, the Ga 3d binding energies were 18.43, 18.35, and 18.81 eV, respectively, and the peak intensity ratios of the Ga—O/Ga—N were 0.46, 0.30, and 0.26, respectively, as shown in FIG. 2B. The Ga 3d binding energy of the GaN was decreased with $Al_2O_3$ deposition (sample B) and was increased with AlN/$Al_2O_3$ deposition (sample C), compared to that of the reference GaN LED wafer (sample A). The increased Ga 3d binding energy with the AlN/$Al_2O_3$ stacked layers indicates the increased surface potential of GaN. The decreased Ga—O/Ga—N ratio with the $Al_2O_3$ layer and the more decreased ratio with the AlN/$Al_2O_3$ stacked layers proved the better passivation quality of AlN/$Al_2O_3$ in relation to $Al_2O_3$. FIG. 2C shows the XPS Al 2p core level binding energies of samples B and C, which were 74.48 and 73.89 eV, respectively. The shift of the Al 2p core level binding energy was due to the different band gaps of the two interface materials (i.e., AlN versus $Al_2O_3$).

Surface Band Characteristics

Figure 3A:
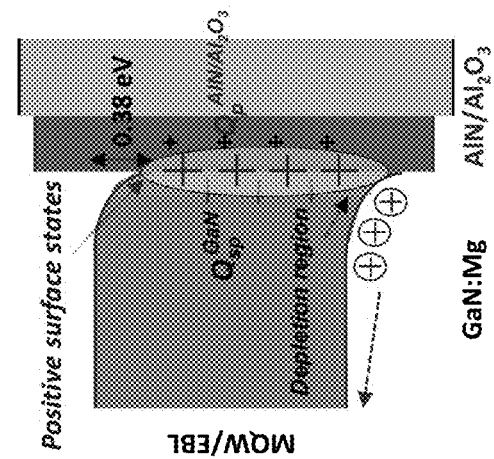
FIGS. 3A-3C depict the band bending, surface potential, and hole injection of the sample A, B, and C LEDs.
Figure 3B:
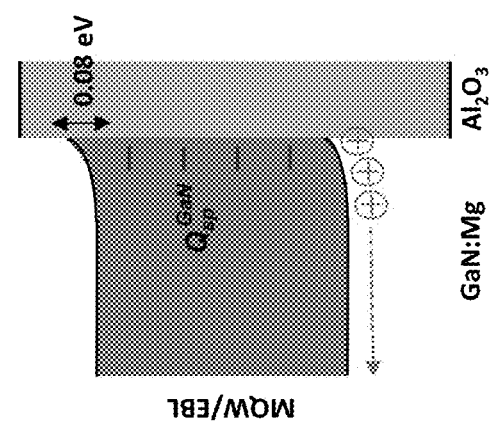
Figure 3C:
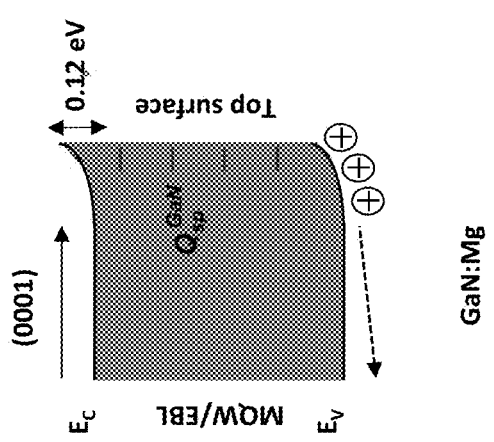

The three samples characterized by XPS were fabricated together into LEDs. The shifts in the binding energy of the atomic core levels due to the different interface/surface conditions induced surface potential changes and the corresponding band bending situations. Based on the XPS results, the band bending and surface potential of the three types of LEDs are depicted in FIGS. 3A, 3B, and 3C, respectively. Sample A shows upward band bending with 0.12 eV surface potential based on the 18.31 eV Ga 3d binding energy of the as-cleaned GaN:Mg. The upward band bending of sample A was originated from the negative bound sheet charges that came from the internal spontaneous polarization field in the GaN (FIG. 3A). Due to the upward valence band bending, holes in the GaN were "confined" in the potential valley, which impeded hole injection. The deposition of the $Al_2O_3$ layer (sample B) resulted in a lower surface potential and band bending as compared to that of sample A, which exhibited a surface potential of only 0.08 eV but still produced upward bending (FIG. 3B). For sample C, a 0.38 eV surface potential and downward band bending were formed on the surface of the GaN:Mg (FIG. 3C). The change in the band bending direction from upward bending in samples A and B to downward bending in sample C indicated that positive surface charges were formed at the GaN/AlN interface, which is solely due to the deposition of the AlN/Al$_2$O$_3$ layers. From the capacitance-voltage measurements in our previous study, a fixed sheet positive charge density of ~3.20×10$^{13}$ cm$^{-2}$ was formed at the AlN/GaN interface with the PEALD AlN/Al$_2$O$_3$ stacked layers. (See, S. Huang, et al., IEEE Electron Device Lett. 34 (2013) 193-195.) Due to the monocrystal-like structure of the PEALD-AlN layer, the positive charges can be considered polarization charges. The positive surface charges at the interface induced by the AlN/Al$_2$O$_3$ over-compensated for the negative spontaneous polarization charges of 2.10×10$^{13}$ cm$^{-2}$ in the GaN. Therefore, positive surface states at the interface were formed which led to downward band bending at the surface of GaN. The downward band bending facilitated hole injection into the MQW. In addition, the repulsive force from the positive polarization charges at the AlN/GaN interface also enhanced hole transport. The combination of the above situations led to a reduced surface recombination of holes.

Figures 4A, 4B:
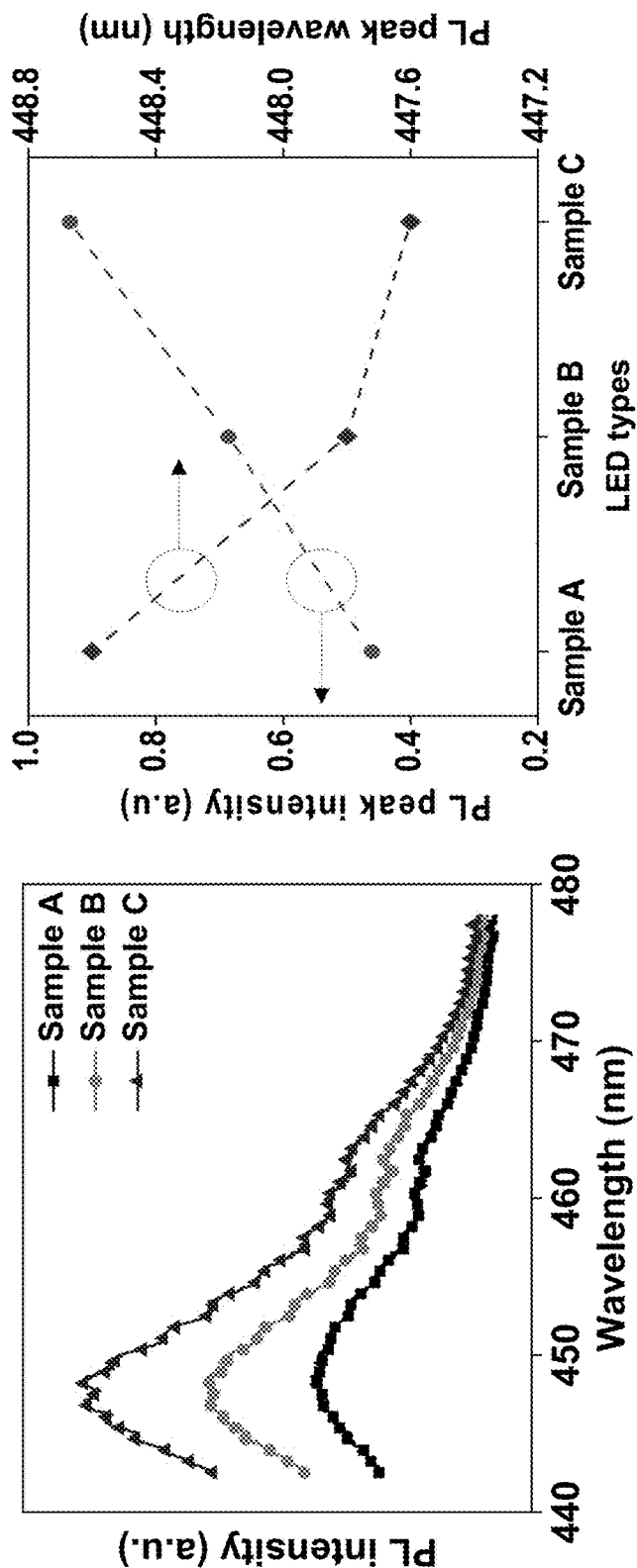
FIGS. 4A-4B show the photoluminescence (PL) properties of the three samples.

FIG. 4A shows the PL spectra of the three samples. The peak wavelengths of samples A, B and C LEDs were 448.6 nm, 447.8 nm, and 447.6 nm, respectively, with gradual increasing peak intensities (FIG. 4B) that were measured under the same conditions. The increased PL intensities of samples B and C, compared to sample A, were attributed to the reduced surface recombination of holes. The blue shift in the peak wavelengths was possibly due to the reduced internal polarization field in the GaN that was caused by the compensation of surface polarization charges due to top layer depositions.

Characteristics of LEDs

Figure 5B:
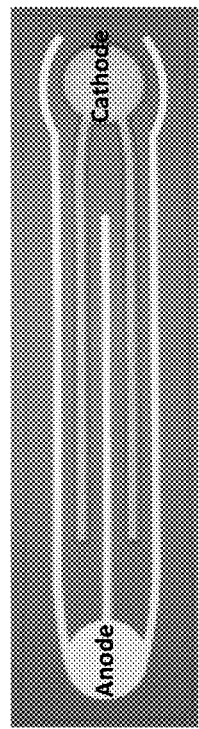
FIG. 5B shows the equivalent circuit model for the LED of FIG. 5A.
Figure 5C:
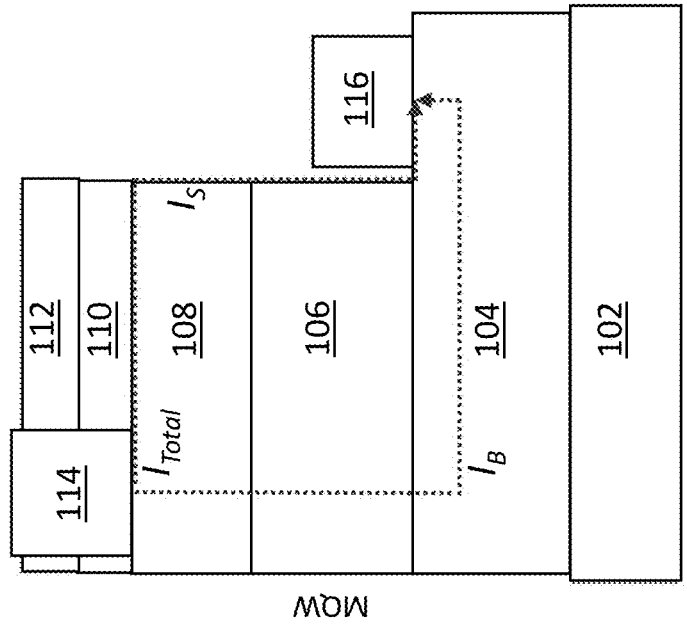
FIG. 5C is an image of an LED having three anode and two cathode fingers.

The vertical structure of the fabricated GaN LED with AlN/Al$_2$O$_3$ stacked layers (sample C LED) is shown in FIG. 5A. The surface states relating to the leakage path in parallel with the bulk current (I$_B$) are labelled as I$_s$. I$_{total}$ is the sum of I$_B$ and I$_s$. The equivalent circuit of the LED is shown in FIG. 5B. R$_{AC}$ and R$_{CC}$ are the anode and cathode contact resistances, respectively. R$_B$ is the bulk series resistance and D$_B$ represents the bulk diode. It is noted that R$_B$ was mainly due to the resistance of GaN:Mg. The surface leakage I$_S$ can be reduced by the deposition of top surface layers. FIG. 5C shows a top view of the GaN LED with three anode and two cathode fingers in order to maximize the current spreading length and light-emission intensity.

Figure 5D:
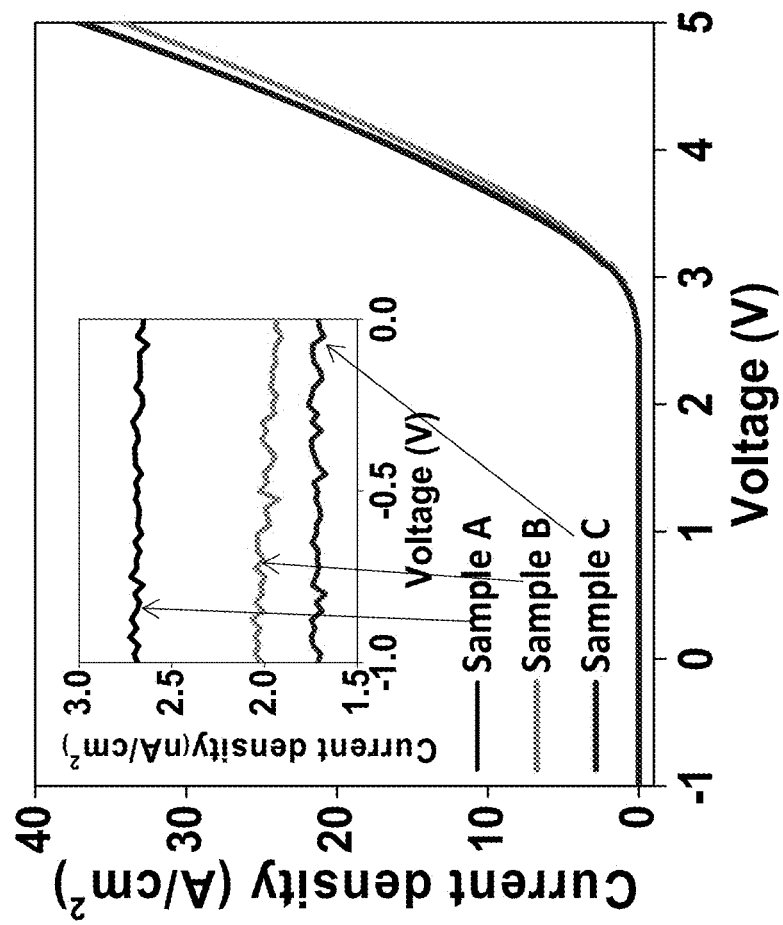
FIG. 5D shows the current density-voltage (J-V) characteristics of three types of LEDs. The inset in FIG. 5D shows a comparison of the current levels of the three types of LEDs under reverse bias.

FIG. 5D shows the measured current density versus bias voltage of the three LEDs. In the sample B LED under bias V, the I$_S$ can be reduced with Al$_2$O$_3$ passivation and thus the I$_{Total}$ can also be reduced relative to the total current level of the sample A LED. In the case of the sample C LED under the same bias, the I$_S$ should also be reduced with the passivation of AlN/Al$_2$O$_3$ layers. However, the enhanced hole injection improves the I$_B$. The diode ideality factors (n) of the three types of LEDs were calculated to be 2.03 (sample A), 1.69 (sample B) and 1.58 (sample C) by the equation n=e/kT·δ V/δ ln I, where k is the Boltzmann constant. (See, K. Kim, et al., ACS Appl. Mater. Interfaces 8 (2016) 2764-2773.) The inset of FIG. 5D shows the decreased leakage current levels of the sample B and C LEDs, which confirms the passivation effects of Al$_2$O$_3$ and AlN/Al$_2$O$_3$ at different levels, respectively.

EL Property of the LEDs

Figure 6A:
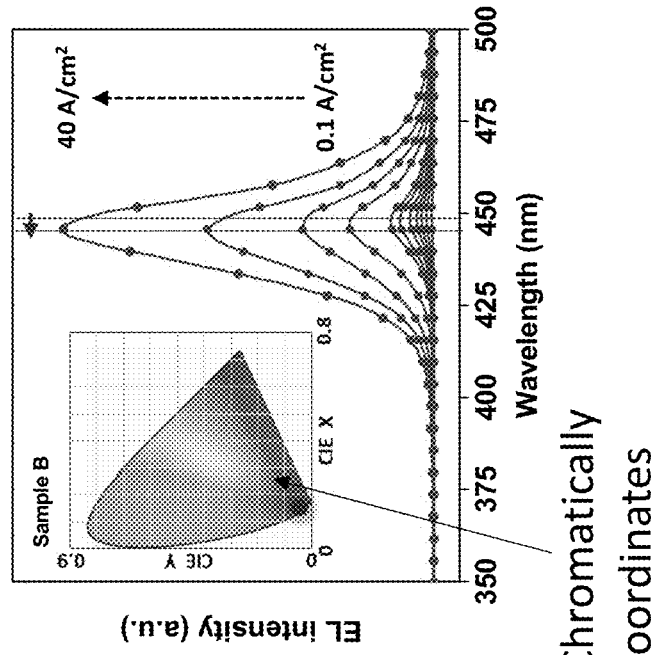
FIGS. 6A-6E depict electroluminescence (EL) properties of the sample A, B, and C GaN LEDs.
Figure 6B:
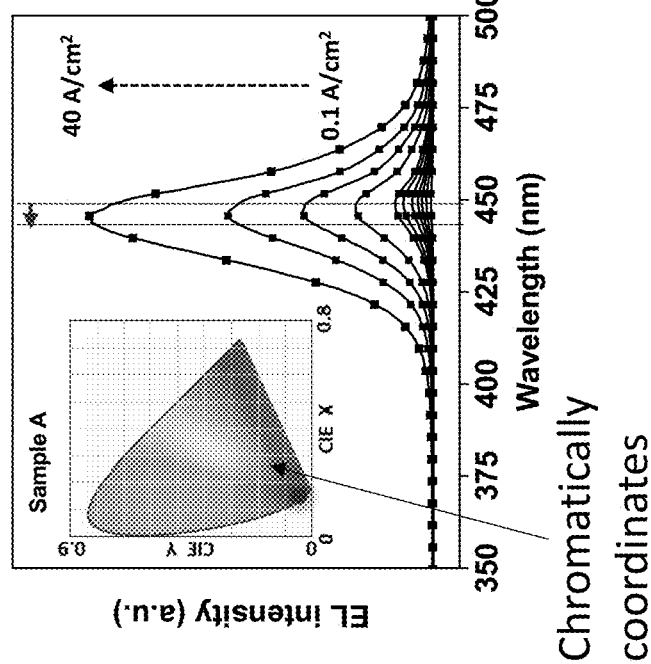
Figures 6C, 6D:
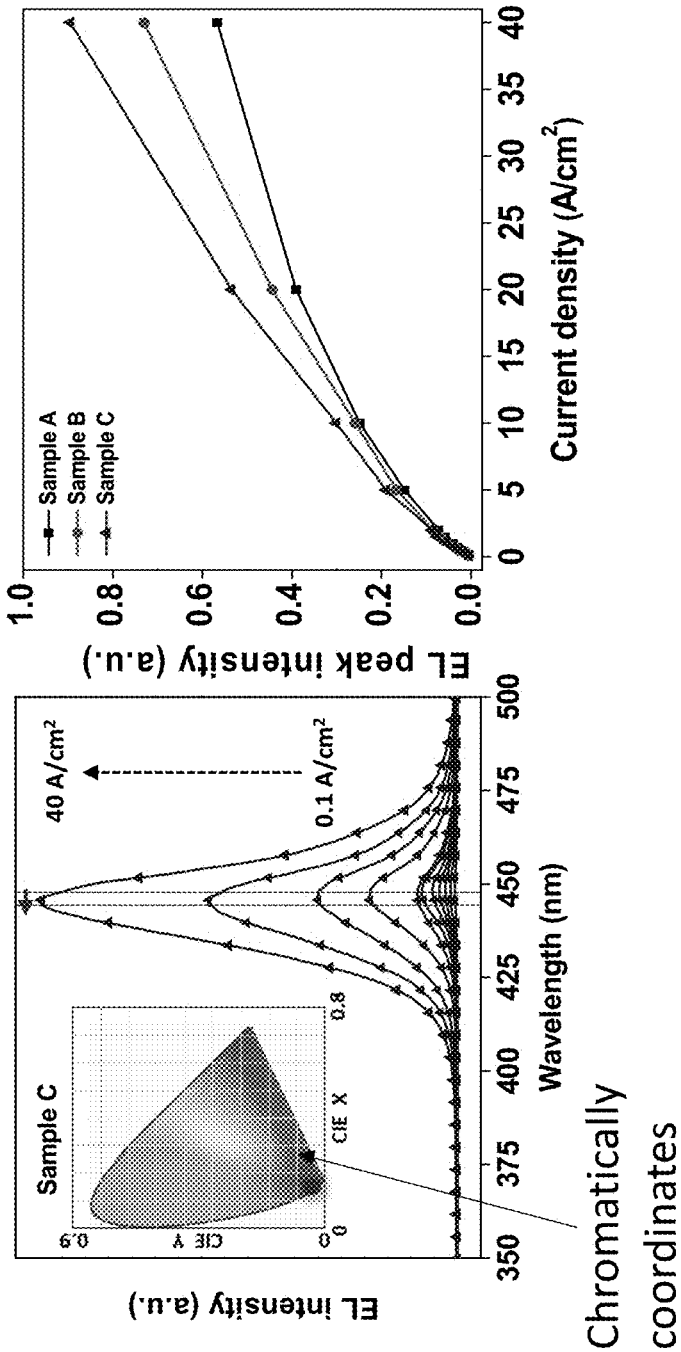

The EL spectra of the three types of LEDs with a driving current density from 0.1 to 40 A/cm$^2$ are exhibited in FIGS. 6A, 6B, and 6C, respectively. The dashed lines indicate the EL peak wavelengths at 0.1 A/cm$^2$ and 40 A/cm$^2$. The chromaticity coordinates of the EL spectra of the three LEDs are plotted within the adjacent blue area of the CIE 1931 chromaticity diagrams in the insets of FIGS. 6A, 6B, and 6C, separately. As can be seen, the EL intensities of the sample B and C LEDs are higher than that of the sample A LED, with the intensity of the sample C LED being the highest at every driving current density level, as shown in FIG. 6D. The sample C LED had the highest EL peak intensity, compared to the other two samples, due to the increased electron-hole pair (EHP) recombination rate in the MQW by the passivation and enhanced hole injection rate with the deposition of the AlN/Al$_2$O$_3$ stacked layers.

Figure 6E:
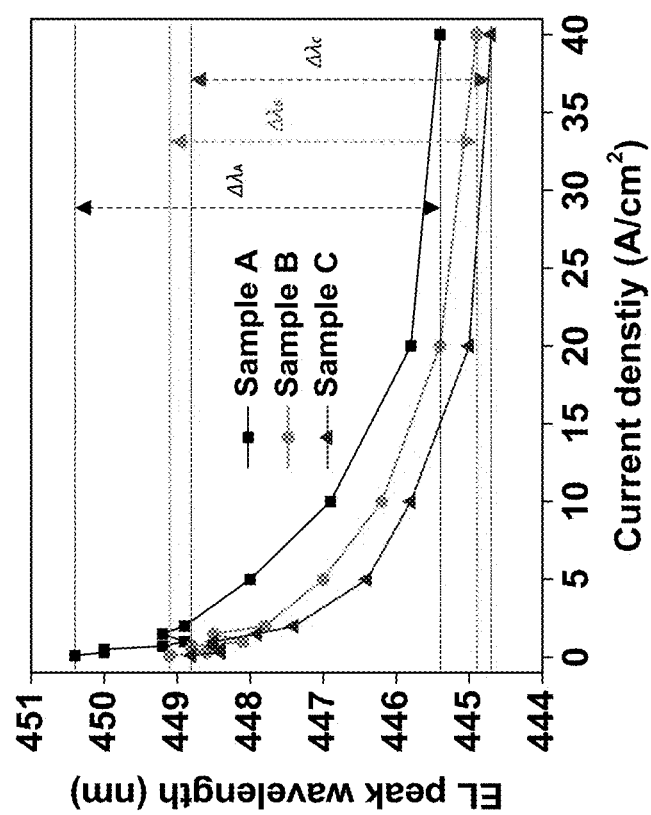

FIG. 6E shows the EL peak wavelengths of the three types of LEDs as a function of driving current density. The blue-shift is attributed to the band-filling of localized potential energy states and to the screening of internal polarization fields in the MQW by the injected carriers. Specifically, the peak wavelengths of the LEDs at the current density of 0.1 A/cm$^2$ were 450.4 nm, 449.1 nm and 448.8 nm for samples A, B, and C LEDs, respectively. The peak wavelengths of the three samples were shifted to 445.4 nm (−5 nm), 444.9 nm (−4.2 nm), and 444.7 nm (−4.1 nm) as the current density increased to 40 A/cm$^2$, respectively. The smallest blue-shift of the peak wavelength (Δλ$_C$) and the highest photon energy (E$_{ph}$=hc/λ, where h is the Plank's constant, c is the light velocity, and λ is the wavelength of light) of sample C LED indicate that the band-filling and screening of internal polarization effects were maximized by the deposition of the AlN/Al$_2$O$_3$ stacked layers in sample C.

Light Output Power of the LEDs

Figure 7B:
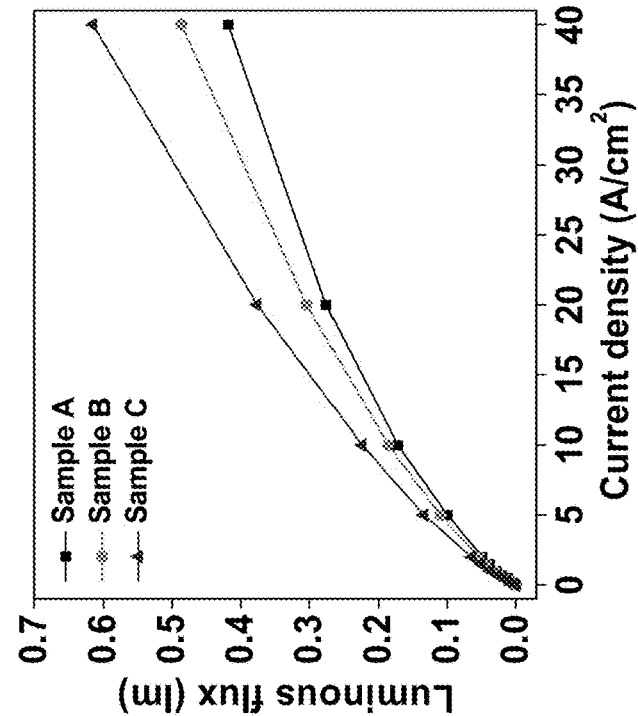
FIGS. 7A-7C depict the light output power of the LEDs.
Figure 7A:
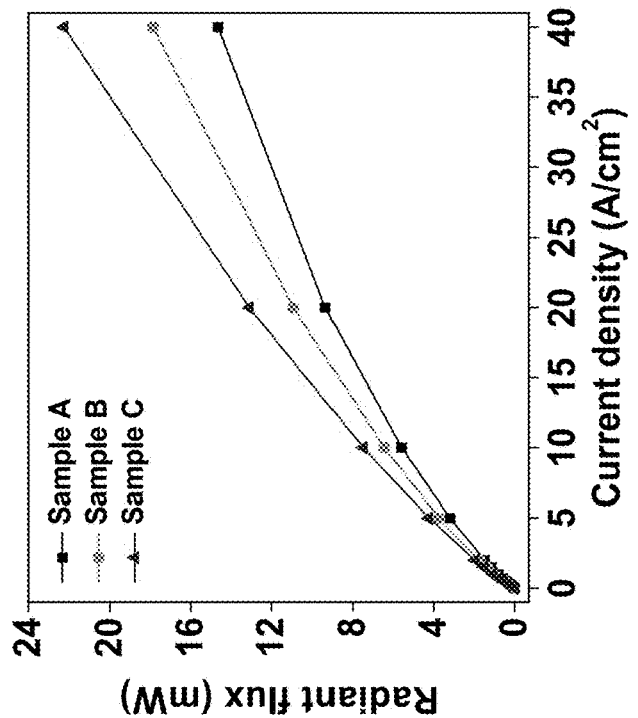
Figure 7C:
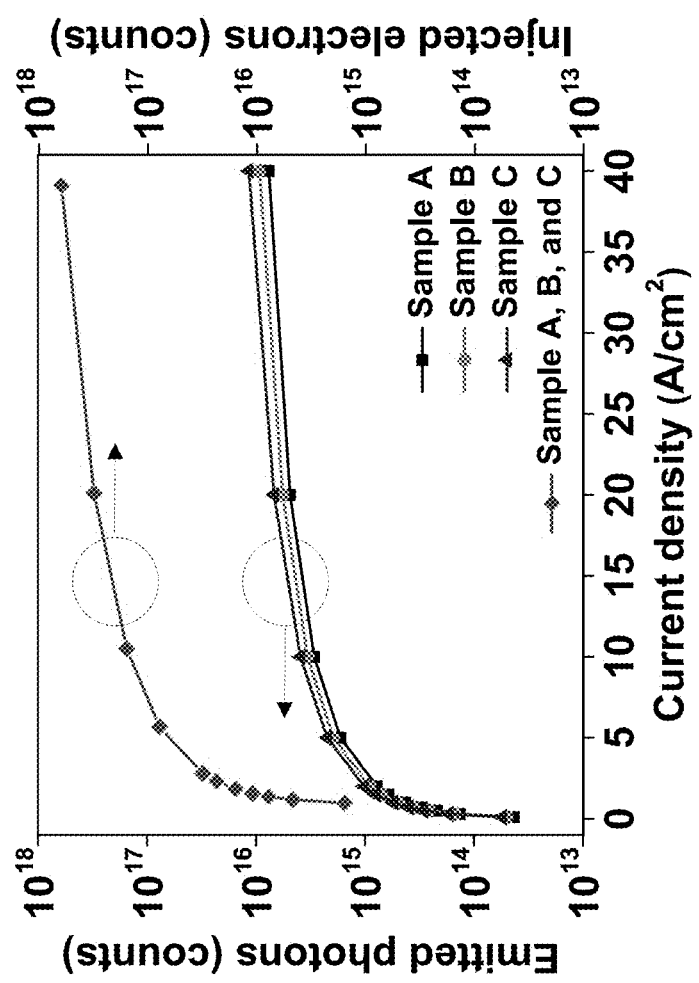

FIG. 7A shows the plotted radiant flux of the three types of LEDs as a function of current density. The optical output powers of the sample B and C LEDs were improved by 22% and 52%, respectively, as compared to that of the reference sample A LED at a current density of 40 A/cm$^2$. The luminous flux as a function of current density shown in FIG. 7B also exhibited improved optical output power for the sample B and C LEDs by 16% and 47%, respectively, as compared to that of the sample A LED. The improved radiant flux and luminous flux of the samples B and C LEDs were attributed to the passivation effects of the Al$_2$O$_3$ and AlN/Al$_2$O$_3$ layers, in addition to the increased hole injection rate by the AlN/Al$_2$O$_3$ layers. The reduced surface recombination of holes with the AlN/Al$_2$O$_3$ stacked layers also contributed to the improved output power. The reduction in the slopes of the radiant flux and luminous flux as the driving current density increased was probably due to the self-heating effect [44]. With the assumption that the initial radiative recombination coefficient inside the GaN LEDs is identical because of the identical epi-growth structures, the increased number of emitted photons from samples B and C LEDs is considered direct evidence supporting the effects of different top surface layers on the performance improvement of the LEDs. FIG. 7C plots the number of emitted photons and injected electrons for the LEDs, in which the number of emitted photons varies according to the sample types with the same number of injected electrons. Since the number of injected electrons was larger than the number of emitted photons, the increased photon emission of the sample B and C LEDs was attributed to more hole injection into their MQW for the EHP recombination. In other words, the surface deposition layers enhanced the radiative recombination rate through surface passivation and the increase in hole injection.

Mechanism Discussion

Figure 8A:
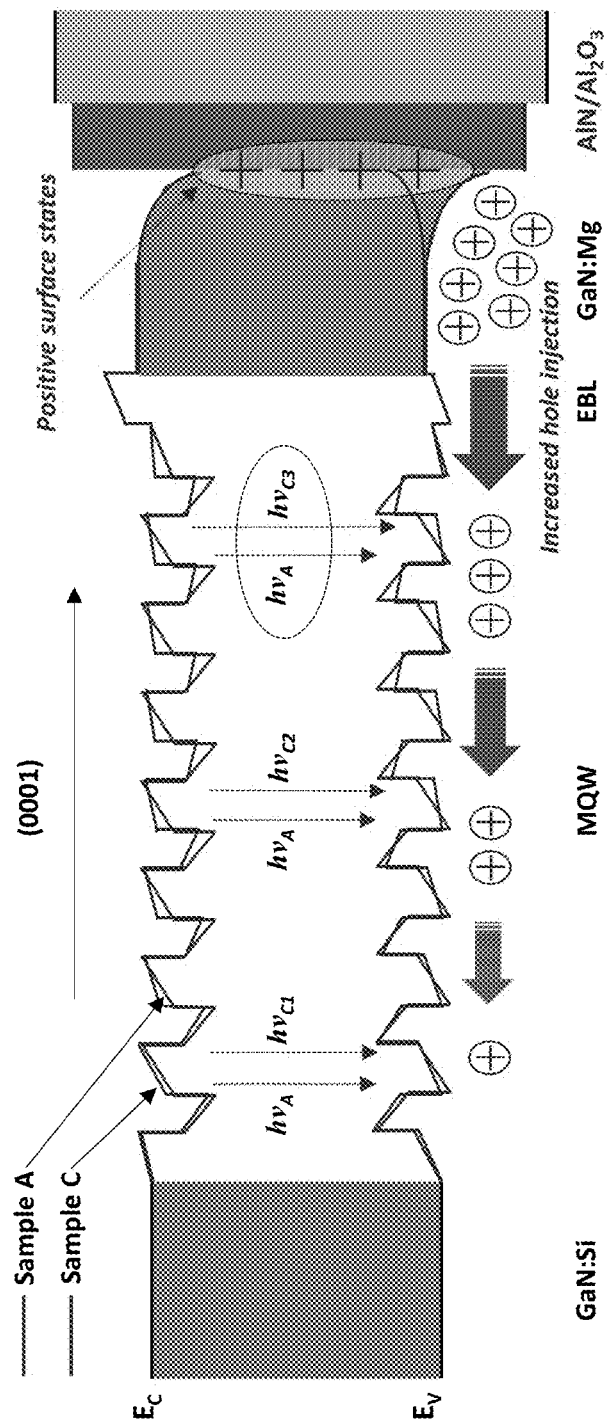
FIGS. 8A-8C show the mechanism of LED performance enhancement with top surface AlN/Al$_2$O$_3$ stacked layers.
Figure 8B:
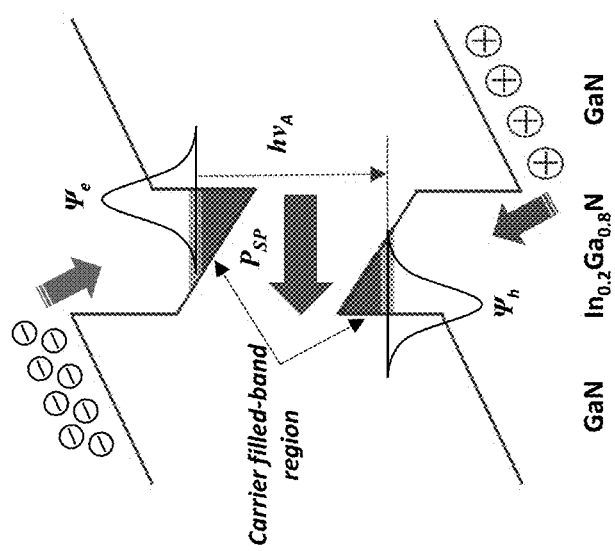
Figure 8C:
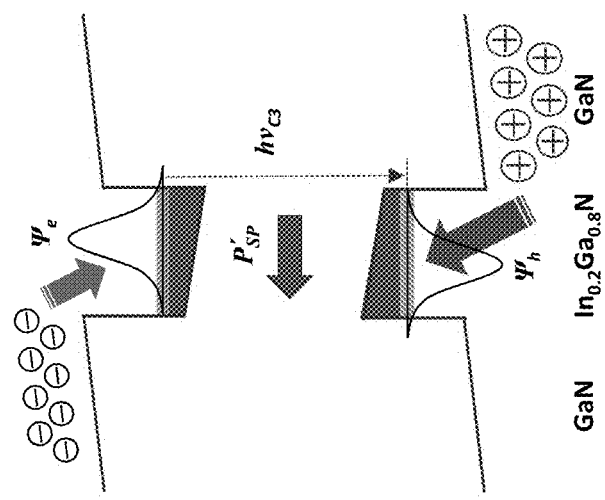

FIG. 8A depicts the energy band diagrams of the samples A and C LEDs, in which the red and the blue solid lines represent the band diagrams before (sample A) and after (sample C) the deposition of AlN/Al$_2$O$_3$ top surface layers. With the AlN/Al$_2$O$_3$ layers, the positive surface states were formed at the AlN/GaN interface, which induces the downward surface band bending and increases the hole injection rate into the MQW for radiative recombination. The increased number of injected holes induced the band-filling effect and the screening of the internal polarization field in the MQW of the GaN LED. Since the QWs in close proximity to the p-type GaN side benefits more from the increased hole injection than others far away, the band-filling and screening effects were more effective adjacent to the p-type side than the n-type side, thereby leading to enhanced photon energy in the MQW of the sample C LED, so $hv_{C3} > hv_{C2} > hv_{C1}$, where v is the frequency of the emitted light. The sample A LED, however, showed a similar photon energy ($hv_A$) across the MQW. For a detailed explanation, the individual InGaN/GaN QWs of the samples A and C LEDs next to the p-type GaN/EBL are enlarged in FIGS. 8B and 8C, respectively, including injected charge carriers, electron and hole wave functions ($\Psi_e$ and $\Psi_h$), and internal spontaneous polarization field in the GaN ($P_{SP}$). In the QW of the sample A LED (FIG. 8B), the internal polarization field tilted the slope of the QW, which reduced the spatial distribution of the electron and hole wave functions. Due to the smaller overlapping areas of the wave functions, the EHP recombination rate became less efficient (i.e., QCSE). In the case of the sample C LED with the increased hole injection rate into the QW (FIG. 8C), the spontaneous polarization field was compensated for by the screening effect of the increased hole concentration in the QW. Therefore, the reduced polarization field ($P'_{SP}$) decreased the energy slope of QW, leading to an increased overlapping area and vertical distance between the electron and hole wave functions. As a result, the radiative recombination rate increased and the energy of the emitted photons also increased relative to the sample without surface deposition of AlN/Al$_2$O$_3$ (i.e., the sample A LED). Overall, the surface deposition of AlN/Al$_2$O$_3$ suppressed the QCSE.

LED Efficiency Characterizations

Figure 9B:
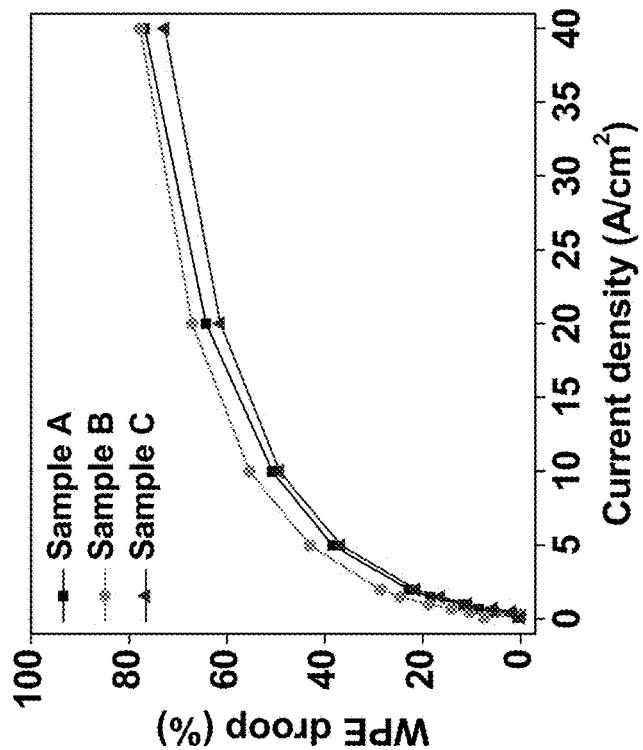
FIGS. 9A-9F depict efficiency properties of LEDs.
Figure 9A:
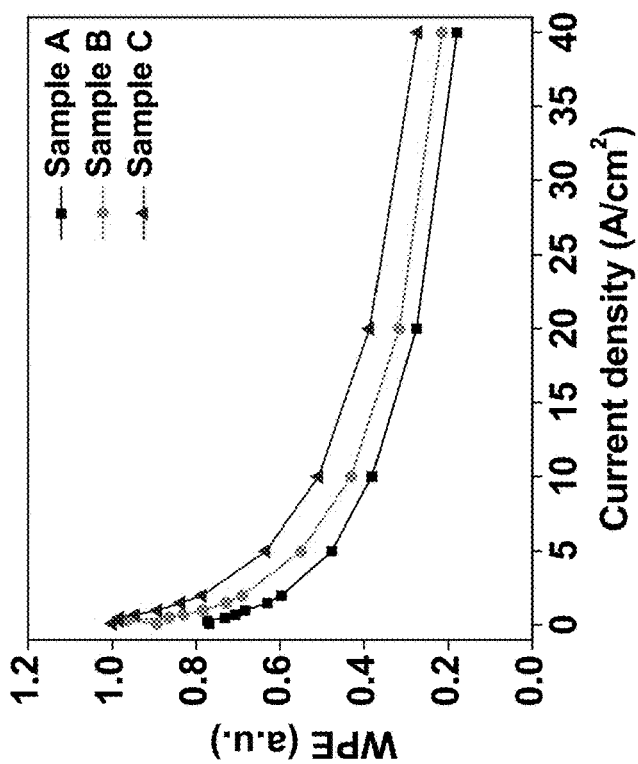
Figures 9C, 9D:
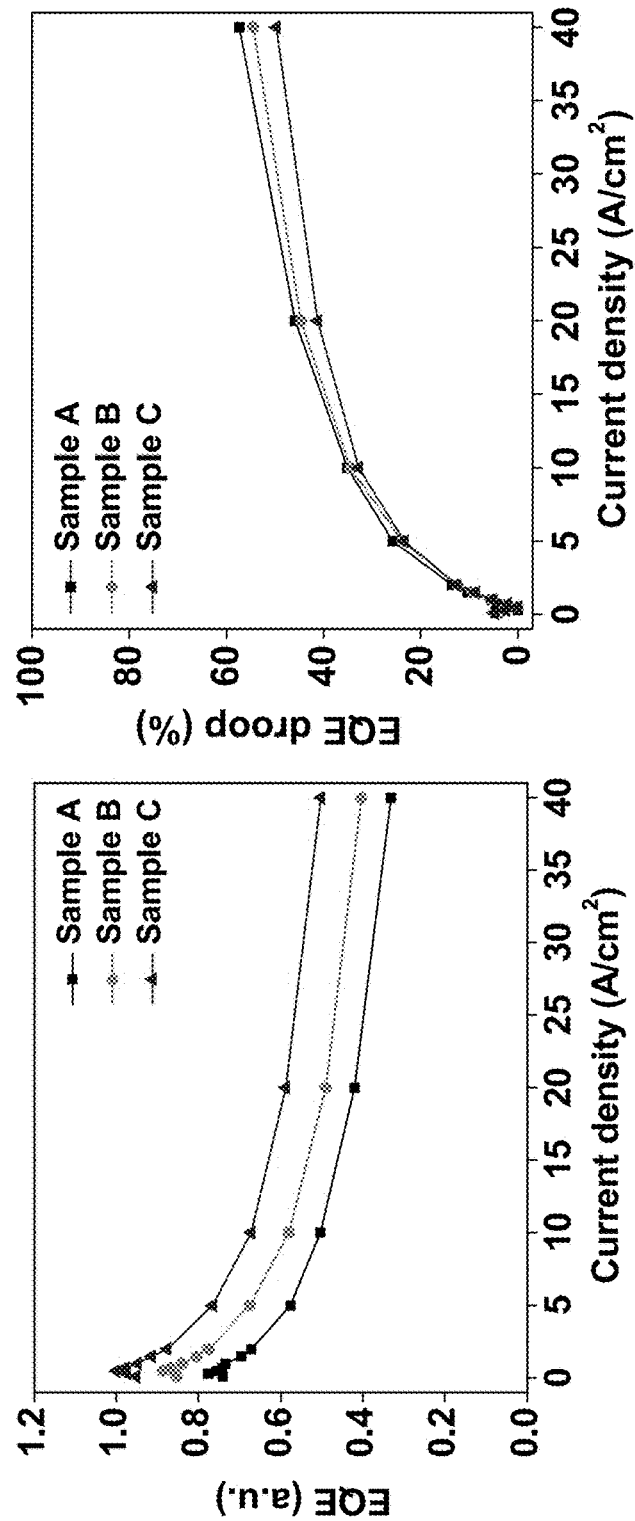
Figures 9E, 9F:
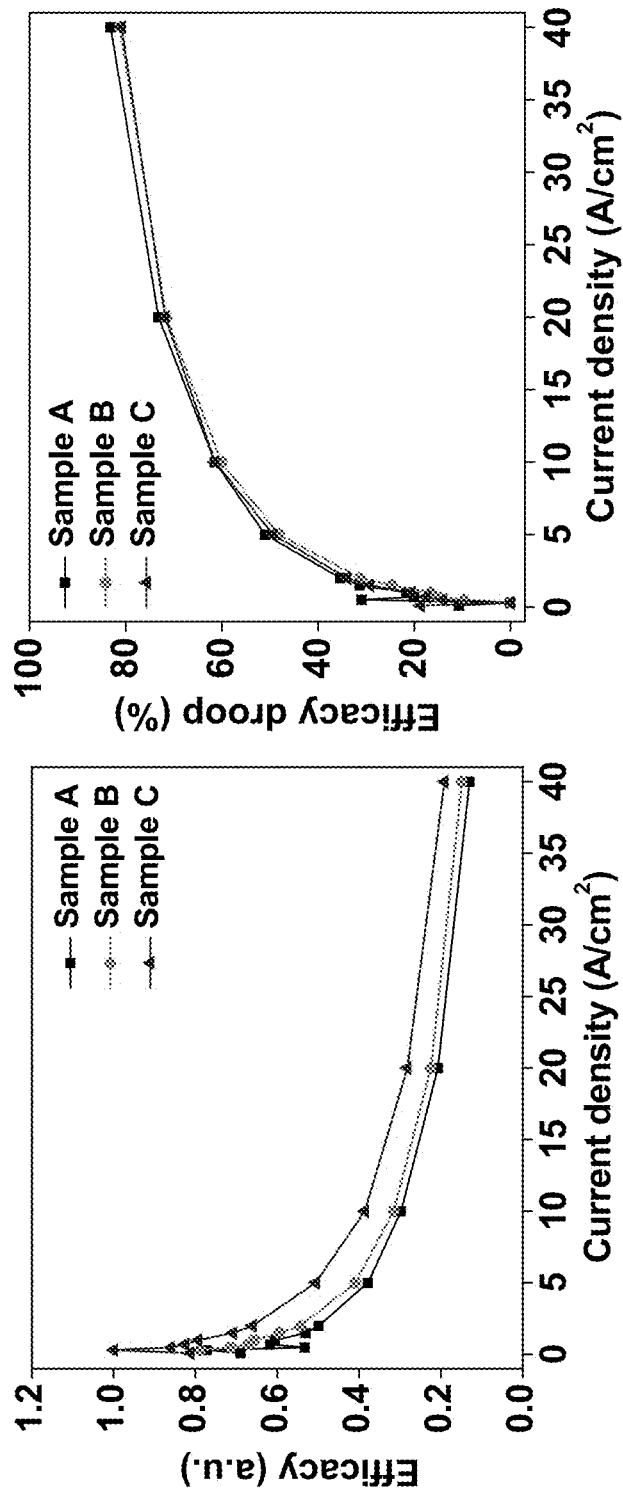

In order to assess the effects of the deposition of top surface layers on the efficiency enhancement in the GaN LEDs, WPE, EQE, and Efficacy and their droop rates were estimated for the three types LEDs. The WPE and efficiency droop rates as a function of current density in FIGS. 9A and 9B exhibited the highest peak efficiency of the sample C LED and the efficiency droop behaviors of all three samples as the current density increased. The peak efficiency at 0.3 A/cm$^2$ and the efficiency droop rate at 40 A/cm$^2$ of the sample C LED were improved by 29% and 13%, respectively, compared to the sample A LED. Along with the WPE, the EQE and its droop rate, as shown in FIGS. 9C and 9D, exhibited the peak efficiency at 0.3 A/cm$^2$ and efficiency droop rate at 40 A/cm$^2$ of the sample C LED, and were improved by 29% and 6%, respectively, compared to sample A LED. Also, the Efficacy and its droop rate, as shown in FIGS. 9E and 9F, showed the peak efficiency at 0.3 A/cm$^2$ and efficiency droop rate at 40 A/cm$^2$ of the sample C LED, and were improved by 30% and 3%, respectively, compared to the sample A LED. The enhanced peak efficiencies and reduced droop rates of the sample C LED were ascribed to an improved radiative recombination rate and reduced electron leakage in the MQW with the increased hole injection. The increased hole concentration in the MQW for the sample C LED reduced the asymmetry of concentrations of electrons and therefore contributed to more recombination of EHPs.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A light-emitting device comprising:
   a hole injection layer comprising a single-crystalline p-type doped Group III-nitride semiconductor;
   an electron injection layer comprising a single-crystalline n-type doped Group III-nitride semiconductor;
   a light-emitting active region comprising intrinsic or n-type doped Group III-nitride semiconductor layers disposed between the hole injection layer and the electron injection layer, the light-emitting active region comprising a multiple quantum well structure comprising alternating barrier layers and quantum well layers;
   a layer of aluminum nitride on the hole injection layer; and
   a layer of aluminum oxide on the layer of aluminum nitride, wherein the hole injection layer is disposed between the layer of aluminum nitride and the light-emitting active region and the layer of aluminum nitride is disposed between the layer aluminum oxide and the hole injection layer.

2. The device of claim 1, wherein the p-type doped Group III-nitride semiconductor of the hole injection layer is p-type doped GaN.

3. The device of claim 1, wherein the barrier layers comprise intrinsic GaN and the quantum well layers comprise intrinsic InGaN.

4. The device of claim 1, wherein the p-type doped Group III-nitride semiconductor of the hole injection layer is p-type doped In$_x$Ga$_{(1-x)}$N, where $0 \le x \le 0.3$.

5. The device of claim 4, wherein the barrier layers comprise intrinsic GaN and the quantum well layers comprise intrinsic InGaN.

6. The device of claim 1, wherein the p-type doped Group III-nitride semiconductor of the hole injection layer is p-type doped AlGaN.

7. The device of claim 6, wherein the barrier layer comprises intrinsic AlN and the quantum well layers comprise intrinsic AlGaN.

8. The device of claim 1, wherein the p-type doped Group III-nitride semiconductor of the hole injection layer is p-type doped Al$_x$Ga$_{(1-x)}$N, where $0 \le x \le 0.55$.

9. The device of claim 8, wherein the barrier layer comprises intrinsic AlN and the quantum well layers comprise intrinsic AlGaN.

10. The device of claim 1, wherein the layer of aluminum nitride and the layer of aluminum oxide each have a thickness of no greater than 3 nm.

11. The device of claim 1, wherein at least one of the device's wall-plug efficiency, external-quantum efficiency, and luminous efficiency is increased by 10%, relative to a light-emitting device that lacks both the layer of aluminum nitride and the layer of aluminum oxide, but otherwise has the same device structure.

12. The device of claim 1, wherein at least one of the device's wall-plug efficiency, external-quantum efficiency, and luminous efficiency is increased by 20%, relative to a light-emitting device that lacks both the layer of aluminum nitride and the layer of aluminum oxide, but otherwise has the same device structure.

* * * * *